United States Patent [19]
Maruyama

[11] Patent Number: 6,144,708
[45] Date of Patent: Nov. 7, 2000

[54] PHASE-LOCKED LOOP CIRCUIT WITH EQUALIZER AND PHASE LOCKING METHOD

[75] Inventor: Hidenori Maruyama, Tokyo, Japan

[73] Assignee: NEC Corporation, Tokyo, Japan

[21] Appl. No.: 09/083,342

[22] Filed: May 22, 1998

[30] Foreign Application Priority Data

May 26, 1997 [JP] Japan .................................. 9-135454

[51] Int. Cl.[7] .................................................. H03D 3/18
[52] U.S. Cl. ........................ 375/327; 375/373; 375/324
[58] Field of Search .................................. 375/327, 324, 375/326, 344, 371, 373, 375, 229

[56] References Cited

U.S. PATENT DOCUMENTS

| | | | |
|---|---|---|---|
| 4,647,984 | 3/1987 | Suzuki et al. ............................ | 358/326 |
| 4,918,393 | 4/1990 | Yokosuka et al. ....................... | 329/318 |
| 5,999,542 | 12/1999 | Turner et al. ............................ | 370/497 |
| 6,002,717 | 12/1999 | Gaudet ..................................... | 375/232 |

*Primary Examiner*—Stephen Chin
*Assistant Examiner*—Mohammad Ghayour
*Attorney, Agent, or Firm*—Ostrolenk, Faber, Gerb & Soffen, LLP

[57] ABSTRACT

A phase-locked loop circuit, which is used in a radio data communication terminal of the type that obtains a transmission line characteristic during a preamble period in a narrow band modulation mode and equalizes received signals, that can correct an influence due to a phase error even in an environment of frequency selective multipath fading. The phase-locked loop circuit includes a phase rotation section, a replica signal generator, a phase difference detector, a division section, an integration circuit, and a vector converter. An equalizer obtains tap coefficients determined by transmission line characteristics and sets them to the equalizer and the replica signal generator. The equalizer starts to demodulate data and sequentially inputs the demodulated data to the replica signal generator to reproduce I and Q signal components input to the equalizer based on the demodulation data and tap coefficients. The phase difference detector determines a phase difference between a reproduced I signal component and an I signal component to be input to the equalizer adjusted in timing and a phase difference between a reproduced Q signal component and a Q signal component to be input to the equalizer adjusted in timing. The division section arbitrarily weights phase differences. The integration circuit integrates weighted phase differences in symbol units. Then the vector converter converts the integrated value into received signal components and inputs the converted value to the phase rotation section, so that phase errors are corrected.

11 Claims, 3 Drawing Sheets

PHASE-LOCKED LOOP CIRCUIT WITH EQUALIZER AND PHASE LOCKING METHOD

BACKGROUND OF THE INVENTION

The present invention relates to a phase-locked loop circuit that corrects an influence due to a shift in phase during a receiving operation of received signals by a radio data communication terminal in which received signals are equalized by obtaining a transmission line characteristic during a preamble period in a narrow band modulation mode such as the GMSK (Gaussian filtered Minimum Shift Keying) modulation mode. The present invention also relates to a phase locking method.

In many cases, it has been often difficult to use a synthesizer or crystal oscillator with excellent oscillation precision used to generate radio frequency signals. For that reason, a phase-locked loop circuit is normally used in the radio section or baseband section to establish communication under phase error control.

FIG. 4 is a block circuit diagram illustrating a conventional phase-locked loop circuit for BPSK (Binary Phase Shift Keying) modulation. The phased-locked loop circuit consists of a phase comparison circuit 41 for comparing the phase of a received input signal with a remodulated signal, a loop filter 42, a variable frequency oscillator 43, and a remodulation circuit 44 for remodulating demodulated signals.

The BPSK modulation input signal is represented as COS ($2\pi ft+a\pi$) (where f is a carrier frequency and a is a transmission digital signal). The output signal from the variable frequency oscillator 43 is represented as COS ($2\pi ft+a\pi+\Delta\Phi$). The signal COS ($2\pi ft+\Delta\Phi+b\Delta$) is obtained by modulating the output signal COS ($2\pi ft+a\pi+\Delta\Phi$) with a received digital signal b. The phase comparator 41 compares the two signals and then produces a signal ($2\pi ft+b$)−($2\pi ft+\Delta\Phi+a\pi$) (=(b−a)$\pi-\Delta\Phi$). If the received digital signal does not contain an error, a=b. Hence, the phase comparator 41 outputs −$\Delta\Phi$ to cancel the phase error $\Delta\Phi$ of the variable frequency oscillator 43.

However, the problem is that the conventional phase-locked loop circuit cannot normally receive the modulated signal because the frequency spectrum collapses or becomes asymmetrical in the environment subjected to an influence of a frequency selective multipath fading.

SUMMARY OF THE INVENTION

The objective of the present invention is to solve the above-mentioned tasks.

The present invention is made to solve the above-mentioned problems. The objective of the present invention is to provide a phase-locked loop circuit that can correct an influence due to a phase error even in an environment of frequency selective multipath fading, suited for a radio data communication terminal which equalizes receive signals by a transmission line characteristic during preamble in a narrow band modulation mode.

Another objective of the present invention is to provide a phase locking method that can correct an influence due to a phase error even in an environment of frequency selective multipath fading.

The objective of the present invention is achieved by a phase-locked loop circuit comprising received signal reproducing means for reproducing a real part amplitude value and an imaginary part amplitude value based on tap coefficients set to the equalizer and data demodulated by the equalizer, the real part amplitude value and the imaginary part amplitude value each being a received signal before demodulation, timing means for providing timing to a reproduced received signal obtained by delaying and reproducing the receive signal, phase difference detecting means for detecting a phase difference between the reproduced received signal and the delayed received signal before demodulation, weighting means for weighting in a given ratio to remove an influence of distortion due to noises, integrating means for integrating the phase difference in symbol units, vector converting means for converting an integrated value into a cosine value and a sine value, and phase correcting means for correcting the phase of the demodulated received signal based on the cosine value and the sine value.

According to the present invention, in a radio data communication terminal which determines a transmission line characteristic during a preamble period and then implements demodulation by inputting a received signal to an equalizer based on the transmission line characteristic, phase correction is performed by reproducing a received signal before inputting the equalizer based on demodulation data obtained by the equalizer and a tap coefficient obtained for the equalizer and then comparing the resultant reproduced signal with signal components to be input to the equalizer to determine a phase difference.

In the phase-locked loop circuit according to the present invention, the receive signal reproducing circuit comprises a first shift register having stages corresponding to the number of symbols of the transmission line characteristic, for shifting and storing demodulation data demodulated by the equalizer in one symbol unit, a second shift register having stages corresponding to the number of symbols of the transmission line characteristic, for shifting and storing demodulation data demodulated by the equalizer in one symbol unit, a first tap coefficient storage section for storing real part tap coefficients determined by the transmission line characteristic, a second tap coefficient storage section for storing imaginary part tap coefficients determined by the transmission line characteristic, a first multiplier group for respectively multiplying various demodulation data output in parallel from the first shift register by the tap coefficients of the first tap coefficient storage section, a first adder for adding respective multiplication results from the first multiplier group, a second multiplier group for respectively multiplying various demodulation data output in parallel from the first shift register by the tap coefficients of the second tap coefficient storage section, and a second adder for adding respective multiplication results from the second multiplier group.

Moreover, in the phase-locked loop circuit according to the present invention, the phase difference detecting means comprises a first multiplier for multiplying a real part amplitude value of an output signal from the timing means by an imaginary part amplitude value from the received signal reproducing means, a second multiplier for multiplying an imaginary part amplitude value of the output signal from the timing means by a real part amplitude value from the received signal reproducing means, and a subtracter for subtracting a multiplication result from the first multiplier from a multiplication result from the second multiplier.

In the phase-locked loop circuit of the present invention, the receive signal reproducing circuit comprises a replica signal generator.

In the phase-locked loop circuit of the present invention, the timing means comprises a signal delay section.

In the phase-locked loop circuit of the present invention, the weighting means comprises a division section.

In the phase-locked loop circuit of the present invention, the phase correcting means comprises a phase rotation section.

In the phase-locked loop circuit of the present invention, the narrow band modulation mode is a GMSK modulation mode.

According to the present invention, a phase locking method by which an influence due to a phase error is corrected on a radio data communication terminal which equalizes received signals by obtaining a transmission line characteristic during a preamble duration in a narrow band modulation mode, comprising the steps of reproducing a real part amplitude value and an imaginary part amplitude value based on tap coefficients set to an equalizer and data demodulated by the equalizer, the real part amplitude value and the imaginary part amplitude value each being a received signal before demodulation, providing timing to a reproduced received signal obtained by delaying and reproducing the receive signal, detecting means for detecting a phase difference between the reproduced received signal and the delayed received signal before demodulation, weighting in a given ratio to remove an influence of distortion due to noises, integrating the phase difference in symbol units, converting an integrated value into a cosine value and a sine value, and correcting the phase of the demodulated received signal based on the cosine value and the sine value.

In the phase locking method of the present invention, the reproducing step comprises the steps of shifting and storing demodulation data demodulated by the equalizer in one symbol unit, storing real part tap coefficients determined by the transmission line characteristic, respectively multiplying the shifted demodulation data output in parallel by the real part tap coefficients, adding respective multiplication results to obtain a reproduced real part amplitude value, storing imaginary part tap coefficients determined by the transmission line characteristic, respectively multiplying the shifted demodulation data output in parallel by the imaginary part tap coefficients, and adding respective multiplication results to obtain a reproduced imaginary part amplitude value.

In the phase locking method of the present invention, the phase difference detecting step comprises the steps of firstly multiplying a real part amplitude value of an output signal in the timing providing step by an imaginary part amplitude value in said reproducing step, secondly multiplying an imaginary part amplitude value of said output signal in the timing providing step by a real part amplitude value in the reproducing step, and subtracting a multiplication result in the firstly multiplying step from a multiplication result in the secondly multiplying step.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Next, an embodiment of the present invention will be described below in detail with reference to the attached drawings.

Figure 1:
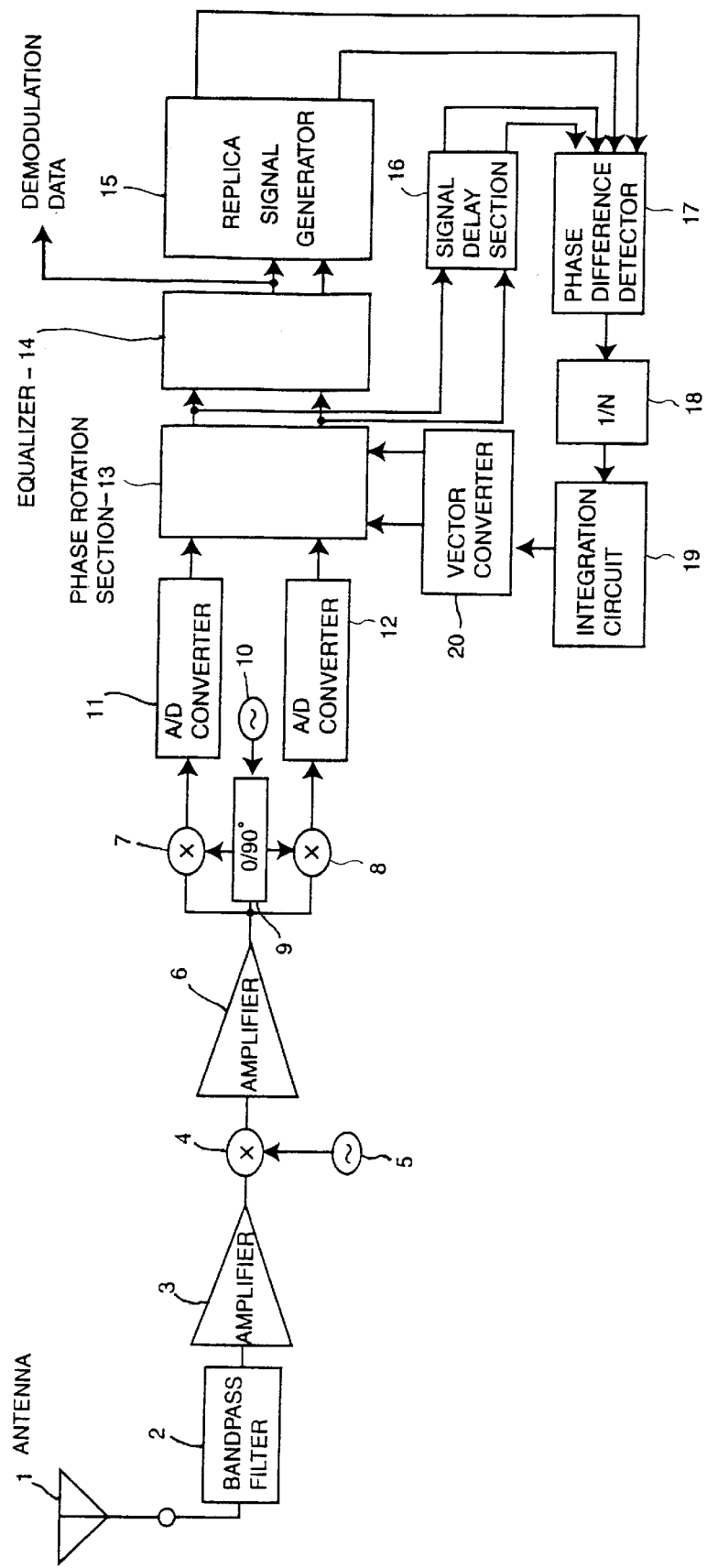
FIG. 1 is a block diagram illustrating a radio data communication terminal with a phase-locked loop circuit according to an embodiment of the present invention.

FIG. 1 is a block circuit diagram showing a radio data communication terminal including a phase-locked loop circuit which uses an equalizer, according to an embodiment of the present invention.

The radio data communication terminal includes an antenna 1 for receiving radio waves transmitted from a receiver side, a bandpass filter 2 for extracting signal components within a desired band from a received signal, an amplifier 3 for amplifying a signal passed through the bandpass filter 2 to a desired level, a mixer 4 used to down-convert a signal into a signal of a desired frequency, an oscillator 5 for generating a signal of a desired frequency, an amplifier 6 for amplifying a signal to a desired level, mixers 7 and 8 each for performing orthogonal demodulation, a 0/90° phase generator 9, an oscillator 10, and an A/D converter 11 for converting into a digital form a real part amplitude value orthogonally demodulated, an A/D converter 12 for converting into a digital form an imaginary part amplitude value orthogonally demodulated. The radio data communication terminal further includes an equalizer 14 for obtaining a tap coefficient desired for equalization and then demodulating the receive signal based on the tap coefficient. The radio data communication terminal still further includes a phase rotation section 13, or phase correction means, for rotating the phase of a receive signal by a desired phase component, a replica signal generator 15, or receive signal generating means, for reproducing a received signal before demodulation based on demodulated data, a signal delay section 16, or timing means, for delaying a received signal to be input to the equalizer 14 to match it with the timing of the output signal from the replica signal generator 15 in symbol units, a phase difference detector 17, or phase difference detecting means, for providing the difference between the phase of the receive signal to be input to the equalizer and the phase of the output signal of the replica signal generator 15, a division section 18, or weighting means, for weighting the phase differences in a given ratio to remove an influence of distortion due to noises, an integration circuit 19, or integrating means, for integrating weighted values in symbol units, and a vector converter 20, or vector converting means, for converting the output of the integration circuit 19 into a cosine value and sine value. The phase locked loop circuit consists of the replica signal generator 15, the signal delay section 16, the phase rotation section 13, the phase difference detector 17, the divider 18, the integrator 19, and the vector converter 20.

A radio section consists of the antenna 1, the bandpass filter 2, the amplifier 3, the mixer 4, the oscillator 5, amplifier 6, the mixers 7 and 8, the phase generator 9, the oscillator 10, and the A/D converters 11 and 12. The radio section produces an I signal component (an imaginary part amplitude value) and a Q signal component (a real part amplitude value) each orthogonally modulated. The equalizer 14 obtains a transmission line characteristic based on the I and Q signal components during a preamble period. The tap coefficients determined based on the transmission line characteristic are set to the equalizer 14 and the replica signal generator 15. The equalizer 14 starts to demodulate data. The replica signal generator 15 sequentially receives data demodulated by the equalizer 14 and then reproduces the I and Q signal components input to the equalizer 14 based on the demodulated data and the tap coefficients.

Thus, phase errors can be obtained because of a time difference between the reproduced I signal component and the I signal component to be input to the equalizer 14 adjusted in timing by the signal delay section 16 and a time difference between the reproduced Q signal component and the Q signal component to be input to the equalizer 14 adjusted in timing by the signal delay section 16. The phase difference ($\Delta\theta$) in symbol unit can be obtained by inputting the I and Q signal components to the phase difference detector 17. The division section 18 implements an arbitrary weighting operation to determine the loop gain. A large loop gain provides a fast response characteristic but causes a large influence of noises. A small loop gain provides a slow response characteristic but reduces an influence of noises. After the integration circuit 19 integrates phase differences in symbol units to convert the resultant phase difference into a frequency, the vector converter 20 converts the integration result into received signal components (a cosine value and a sine value). The phase rotation section 13 receives the received signal components and then controllably rotates it, thus correcting the phase error. The vector conversion can be performed using, for example, a ROM.

Figure 2:
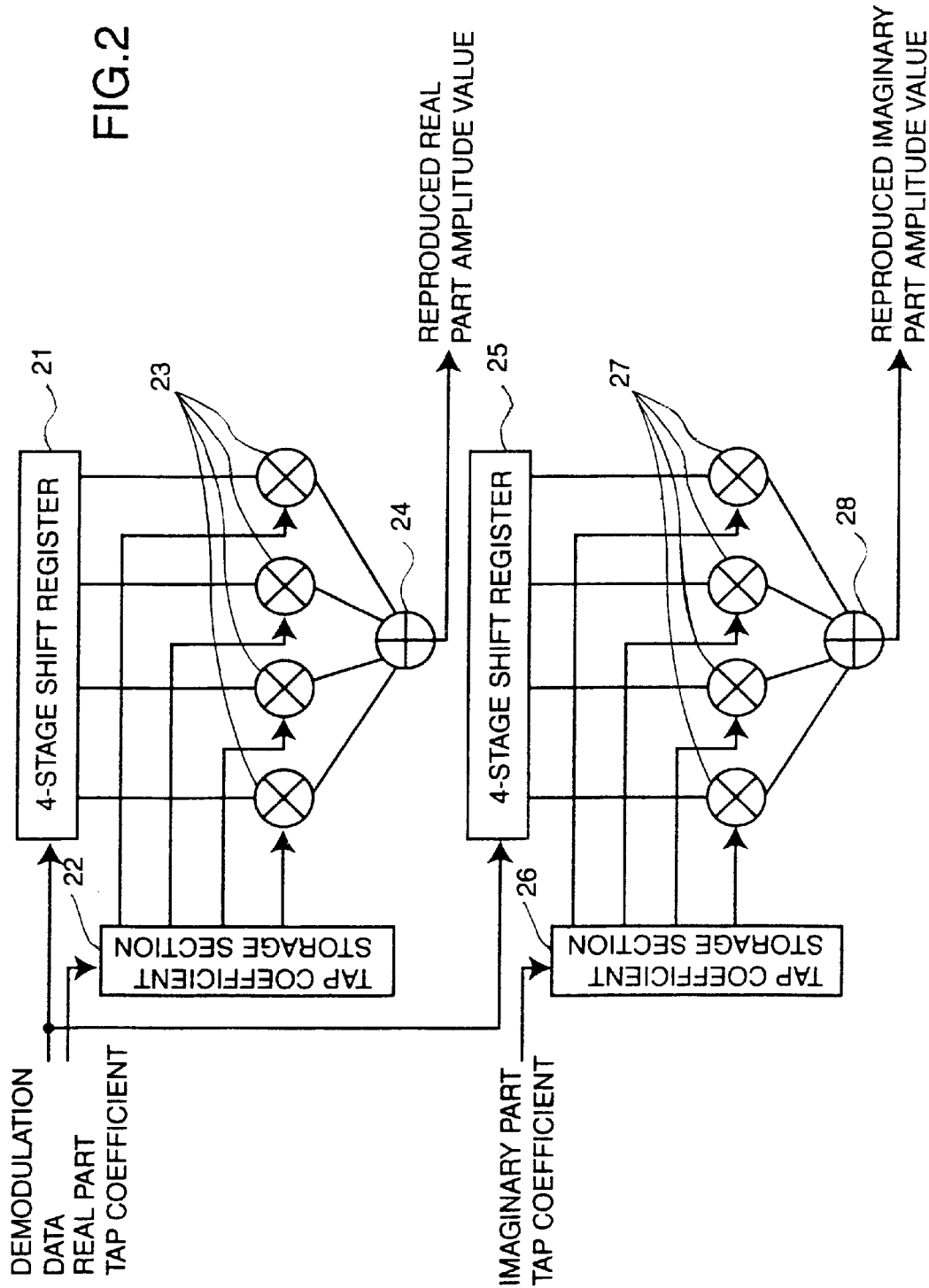
FIG. 2 is a block diagram illustrating in detail the replica signal generator 15 of FIG. 1.
Figure 3:
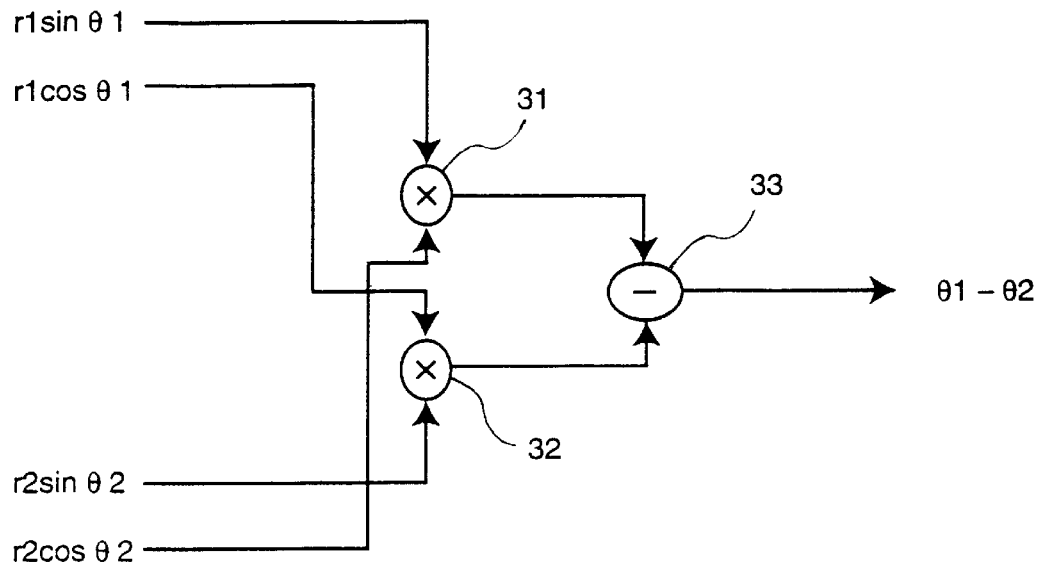
FIG. 3 is a block diagram illustrating in detail the phase difference detector of FIG. 1.
Figure 4:
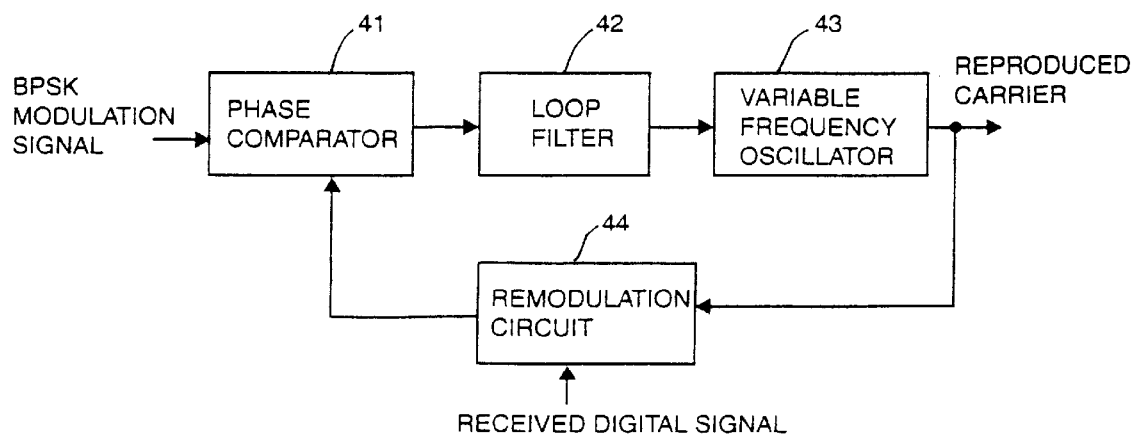
FIG. 4 is a block diagram illustrating a conventional phase-locked loop circuit.

FIG. 2 is a block diagram illustrating the replica signal generator 15. This embodiment shows a replica signal generator having the characteristics for 4 symbols. The replica signal generator 15 consists of shift registers 21 and 25 each for shifting and storing data demodulated by the equalizer 14 on a symbol-by-symbol basis, a real part tap coefficient storage section 22 for storing tap coefficients determined by transmission line characteristics, an imaginary part tap coefficient storage section 26 for storing tap coefficients determined by transmission line characteristics, multipliers 23 each for multiplying a tap coefficient by demodulated data, multipliers 27 each for multiplying a tap coefficient by demodulated data, adder 24 for adding multiplication results from the multipliers 23, and adder 28 for adding multiplication results from the multipliers 27. FIG. 3 is a block diagram illustrating in detail the phase difference detector 17. The phase difference detector 17 consists of multipliers 31 and 32 each for multiplying the signal from the signal delay section 16 by the signal from the replica signal generator 15, and a subtracter for providing the difference between a multiplication result of the multiplier 31 from a multiplication result of the multiplier 32.

First, an operation of the replica signal generator 15 will be described here. Tap coefficients of a real part determined based on the transmission characteristic are stored into the tap coefficient storage section 22 (with 4 taps in this example). Tap coefficients of an imaginary part determined based on the transmission characteristic are stored into the tap coefficient storage section 26 (with 4 taps in this example). Each of the multipliers 23 multiplies each of tap coefficients stored in symbol units by each piece of demodulated data input to the shift register 21. Each of the multipliers 27 multiplies each of tap coefficients stored in symbol units by each pieces of demodulated data input to the shift register 25. The real part amplitude value before demodulation can be reproduced by adding the multiplication results by the adder 24. The imaginary part amplitude value before demodulation can be reproduced by adding the multiplication results by the adder 28.

In operation of the phase difference detector 17, the signal delay section 16 outputs the I output signal represented as $r1 \sin \theta 1$ and the Q output signal represented as $r1 \cos \theta 1$. The replica signal generator 15 outputs the I output signal represented as $r2 \sin \theta 2$ and the Q output signal represented as $r2 \cos \theta 2$. Thus, the subtraction result of the subtracter 33 satisfies the formula of $r1 \sin \theta 1 r2 \cos \theta 2 - r1 \cos \theta 1 r2 \sin \theta 2 = r1r2 \sin(\theta 1 - \theta 2)$. If $\theta 1$ is nearly equal to $\theta 2$, it is regarded as $\sin(\theta 1 - \theta 2) = \theta 1 - \theta 2$, so that the phase difference ($\theta 1 - \theta 2$) can be obtained.

As described above, the present invention relates to a phase-locked loop circuit that corrects the effect due to a phase error on a radio data communication terminal of the type that obtains a transmission line characteristic during a preamble period in a narrow band modulation mode and equalizes received signals. Phase control can be implemented during an receiving operation even in an environment of frequency selective multipath fading, so that cost reduction and expanded communication environment can be accomplished.

The entire disclosure of Japanese Patent Application No. 9-135454 filed on May 26, 1997 including specification, claims, drawing and summary are incorporated herein by reference in its entirety.

What is claimed is:

1. A phase-locked loop circuit with an equalizer, said phase-locked loop circuit that corrects an influence due to a phase error on a radio data communication terminal which equalizes received signals by obtaining a transmission line characteristic during a preamble duration in a narrow band modulation mode, comprising:

received signal reproducing means for reproducing a real part amplitude value and an imaginary part amplitude value based on tap coefficients set to said equalizer and data demodulated by said equalizer, said real part amplitude value and said imaginary part amplitude value each being a received signal before demodulation;

timing means for providing timing to a reproduced received signal obtained by delaying and reproducing said receive signal;

phase difference detecting means for detecting a phase difference between said reproduced received signal and said delayed received signal before demodulation;

weighting means for weighting in a given ratio to remove an influence of distortion due to noises;

integrating means for integrating the phase difference in symbol units;

vector converting means for converting an integrated value into a cosine value and a sine value; and phase correcting means for correcting the phase of said demodulated received signal based on said cosine value and said sine value.

2. The phase-locked loop circuit defined in claim 1, wherein said receive signal reproducing circuit comprises:

a first shift register having stages corresponding to the number of symbols of said transmission line characteristic, for shifting and storing demodulation data demodulated by said equalizer in one symbol unit;

a second shift register having stages corresponding to the number of symbols of said transmission line characteristic, for shifting and storing demodulation data demodulated by said equalizer in one symbol unit;

a first tap coefficient storage section for storing real part tap coefficients determined by said transmission line characteristic;

a second tap coefficient storage section for storing imaginary part tap coefficients determined by said transmission line characteristic;

a first multiplier group for respectively multiplying various demodulation data output in parallel from said first shift register by said tap coefficients of said first tap coefficient storage section;

a first adder for adding respective multiplication results from said first multiplier group;

a second multiplier group for respectively multiplying various demodulation data output in parallel from said first shift register by said tap coefficients of said second tap coefficient storage section; and a second adder for adding respective multiplication results from said second multiplier group.

3. The phase-locked loop circuit defined in claim 1, wherein said phase difference detecting means comprises:

a first multiplier for multiplying a real part amplitude value of an output signal from said timing means by an imaginary part amplitude value from said received signal reproducing means;

a second multiplier for multiplying an imaginary part amplitude value of said output signal from said timing means by a real part amplitude value from said received signal reproducing means; and a subtracter for subtracting a multiplication result from said first multiplier from a multiplication result from said second multiplier.

4. The phase-locked loop circuit defined in claim 1, wherein said receive signal reproducing circuit comprises a replica signal generator.

5. The phase-locked loop circuit defined in claim 1, wherein said timing means comprises a signal delay section.

6. The phase-locked loop circuit defined in claim 1, wherein said weighting means comprises a division section.

7. The phase-locked loop circuit defined in claim 1, wherein said phase correcting means comprises a phase rotation section.

8. The phase-locked loop circuit defined in claim 1, wherein said narrow band modulation mode is a GMSK modulation mode.

9. A phase locking method by which an influence due to a phase error is corrected on a radio data communication terminal which equalizes received signals by obtaining a transmission line characteristic during a preamble duration in a narrow band modulation mode, comprising the steps of:

reproducing a real part amplitude value and an imaginary part amplitude value based on tap coefficients set to an equalizer and data demodulated by said equalizer; said real part amplitude value and said imaginary part amplitude value each being a received signal before demodulation;

providing a timing to a reproduced received signal obtained by delaying and reproducing said receive signal;

detecting means for detecting a phase difference between said reproduced received signal and said delayed received signal before demodulation;

weighting in a given ratio to remove an influence of distortion due to noises;

integrating the phase difference in symbol units, converting an integrated value into a cosine value and a sine value; and correcting the phase of said demodulated received signal based on said cosine value and said sine value.

10. The phase locking method defined in claim 9, wherein said reproducing step comprises the steps of:

shifting and storing demodulation data demodulated by said equalizer in one symbol unit;

storing real part tap coefficients determined by said transmission line characteristic;

respectively multiplying said shifted demodulation data output in parallel by said real part tap coefficients, adding respective multiplication results to obtain a reproduced real part amplitude value;

storing imaginary part tap coefficients determined by said transmission line characteristic;

respectively multiplying said shifted demodulation data output in parallel by said imaginary part tap coefficients; and adding respective multiplication results to obtain a reproduced imaginary part amplitude value.

11. The phase locking method defined in claim 9, wherein said phase difference detecting step comprises the steps of:

firstly multiplying a real part amplitude value of an output signal in said timing providing step by an imaginary part amplitude value in said reproducing step;

secondly multiplying an imaginary part amplitude value of said output signal in said timing providing step by a real part amplitude value in said reproducing step; and subtracting a multiplication result in said firstly multiplying step from a multiplication result in said secondly multiplying step.

* * * * *